(12) United States Patent
Son et al.

(10) Patent No.: US 7,964,521 B2
(45) Date of Patent: *Jun. 21, 2011

(54) GETTER PASTE COMPOSITION

(75) Inventors: Jung-Hyun Son, Hwaseong (KR); Sang-Kyu Lee, Hwaseong (KR); Han-Bok Joo, Hwaseong (KR); Jong-Dai Park, Hwaseong (KR)

(73) Assignee: Dongjin Semichem Co., Ltd., Gajwa-Dong, Seo-Gu, Incheon (KR)

( * ) Notice: Subject to any disclaimer, the term of this patent is extended or adjusted under 35 U.S.C. 154(b) by 250 days.

This patent is subject to a terminal disclaimer.

(21) Appl. No.: 12/204,105

(22) Filed: Sep. 4, 2008

(65) Prior Publication Data

US 2009/0065049 A1  Mar. 12, 2009

(30) Foreign Application Priority Data

Sep. 11, 2007 (KR) .................. 10-2007-0092017

(51) Int. Cl.
*C03C 8/08* (2006.01)
*C03C 8/14* (2006.01)
*C03C 8/16* (2006.01)
*C03C 8/24* (2006.01)
*C03C 3/21* (2006.01)
*C03B 23/00* (2006.01)
*B29C 65/16* (2006.01)
*H01J 9/26* (2006.01)

(52) U.S. Cl. ............... 501/24; 501/15; 501/17; 501/20; 501/46; 501/47; 156/275.5; 65/36; 65/43; 65/58; 445/44; 313/504

(58) Field of Classification Search .................. 501/15, 501/17, 20, 24, 46, 47; 156/89.11, 275.3, 156/275.5, 275.7; 65/36, 43, 58; 445/23, 445/25, 44; 313/504, 506, 512, 498

See application file for complete search history.

(56) References Cited

U.S. PATENT DOCUMENTS

| | | | | |
|---|---|---|---|---|
| 3,885,975 A | * | 5/1975 | Malmendier et al. | 501/41 |
| 5,346,863 A | * | 9/1994 | Hikata et al. | 501/17 |
| 2007/0090759 A1 | * | 4/2007 | Choi et al. | 313/512 |
| 2007/0170846 A1 | * | 7/2007 | Choi et al. | 313/504 |
| 2007/0194710 A1 | * | 8/2007 | Song et al. | 313/512 |
| 2009/0064717 A1 | * | 3/2009 | Son et al. | 65/42 |
| 2009/0068917 A1 | * | 3/2009 | Kim | 445/25 |
| 2009/0136766 A1 | * | 5/2009 | Son et al. | 428/432 |

* cited by examiner

*Primary Examiner* — Karl E Group
*Assistant Examiner* — Elizabeth A Bolden
(74) *Attorney, Agent, or Firm* — Lexyoume IP Group, PLLC.

(57) ABSTRACT

The present invention relates to a getter paste composition, and more particularly, to a getter paste composition which is quickly densified at low densification temperatures to be applied to a device that is weak to heat, provides good adhesiveness, controls moisture and gas effectively and is screen-printable to thereby improve productivity.

9 Claims, 1 Drawing Sheet

[Figure 1]
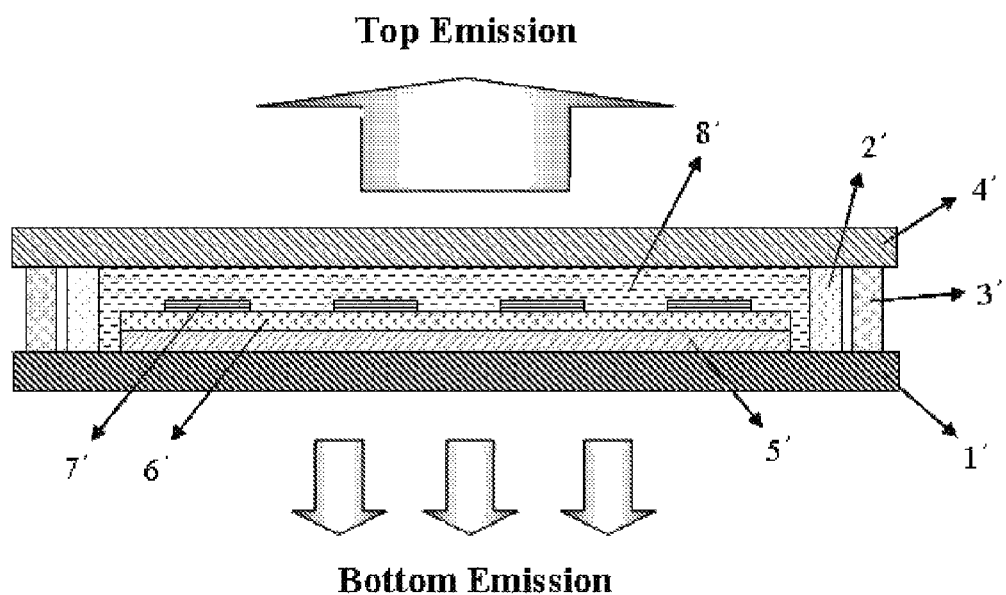

GETTER PASTE COMPOSITION

CROSS-REFERENCE TO RELATED APPLICATION

This application claims priority from Korean Patent Application No. 2007-0092017, filed on Sep. 11, 2007, in the Korean Intellectual Property Office, the disclosure of which is incorporated herein by reference.

BACKGROUND OF THE INVENTION

1. Field of the Invention

The present invention relates to a getter paste composition, and more particularly, to a getter paste composition which is quickly densified at low densification temperatures to be applied to a device that is weak to heat, provides good adhesiveness, controls moisture and gas effectively and is screen-printable to thereby improve productivity, and a manufacturing method of an electronic device using the same.

2. Description of the Related Art

Various electronic devices including the advanced display device may be easily affected by impurities like moisture. It is well known that a getter is used to control the impurities. The getter is a substance that absorbs the impurities or makes them inactive.

Generally, a method of protecting the electronic device from oxygen and moisture by adding a moisture sensitive material to a protection member has been used. Such an addition is designed to protect electronic parts or devices that are sensitive to external impurities including water.

Particularly, an OLED (organic light emitting diode) display device easily deteriorates by interaction between external oxygen and moisture and an electrode of the device, causing a dark spot, pixel shrinkage and decreasing yield. The getter may be used to protect the OLED display device from gas occurring during a sealing process and from impurities. Thus, defective pixels which are formed by external impurities may be minimized.

Conventionally, U.S. Pat. No. 5,591,379 discloses a composition which is used as a drying agent in an electronic device that is tightly sealed, having a coupling agent including dispersed powder. The powder is selected from groups including zeolite molecular sieve, aluminum oxide, silica gel, alkaline earth metal oxide and alkali metal carbonate while the coupling agent includes a continuous matrix of porous glass or porous ceramic.

Korean Patent Application No. 2004-0092532 and No. 2006-0066078 disclose a getter paste composition which is screen printable by dispersing a glass frit having $SiO_2$ and $B_2O_3$, into an organic medium.

Nevertheless, there is still a demand for a getter paste composition which is applicable to a device that is weak to heat, provides good adhesiveness and controls moisture and gas effectively.

SUMMARY OF THE INVENTION

Accordingly, it is an aspect of the present invention to provide a getter paste composition which is quickly densified at low densification temperatures to be applied to a device that is weak to heat, provides good adhesiveness, controls moisture and gas effectively and is screen-printable to thereby improve productivity.

Also, it is another aspect of the present invention to provide a manufacturing method of an electronic device using the getter paste composition and an electronic device manufactured by the manufacturing method.

Additional aspects and/or advantages of the present invention will be set forth in part in the description which follows and, in part, will be obvious from the description, or may be learned by practice of the present invention.

The foregoing and/or other aspects of the present invention are achieved by providing a getter paste composition comprising a) a glass frit having $P_2O_5$ of 10 to 25 mol %, $V_2O_5$ of 40 to 50 mol %, ZnO of 10 to 20 mol %, BaO of 1 to 15 mol %, $Sb_2O_3$ of 1 to 10 mol %, $Fe_2O_3$ of 1 to 10 mol %, $Al_2O_3$ of 0.1 to 5 mol %, $B_2O_3$ of 0.1 to 5 mol %, $Bi_2O_3$ of 1 to 10 mol % and $TiO_2$ of 0.1 to 5 mol %;
b) a getter powder;
c) an organic binder; and
d) an organic solvent.

According to an aspect of the present invention, the getter paste composition comprises
a) a glass frit of 1 to 90 wt %;
b) a getter powder of 1 to 90 wt %;
c) an organic binder of 0.1 to 10 wt %; and
d) an organic solvent of 1 to 80 wt %.

The foregoing and/or other aspects of the present invention are also achieved by providing a manufacturing method of an electronic device including a getter, the getter comprising a getter paste composition.

The foregoing and/or other aspects of the present invention are also achieved by providing an electronic device which is manufactured according to the foregoing method.

BRIEF DESCRIPTION OF THE DRAWINGS

The above and/or other aspects of the present invention will become apparent and more readily appreciated from the following description of the embodiments, taken in conjunction with the accompanying drawings of which:

FIG. 1 illustrates an OLED (organic light emitting diode) device which is sealed by a manufacturing method using a getter paste composition according to a third exemplary embodiment of the present invention. (1': lower glass substrate, 2': getter, 3': glass frit, 4': upper glass substrate, 5': anode, 6': light emitting layer, 7': cathode, 8': photo-curable light transparent composition)

DETAILED DESCRIPTION OF EXEMPLARY EMBODIMENT

Hereinafter, exemplary embodiments of the present invention will be described with reference to accompanying drawings, wherein like numerals refer to like elements and repetitive descriptions will be avoided as necessary.

Hereinafter, the present invention will be described in detail.

A getter paste composition according to the present invention includes a) a glass frit having $P_2O_5$ of 10 to 25 mol %; $V_2O_5$ of 40 to 50 mol %; ZnO of 10 to 20 mol %; BaO of 1 to 15 mol %; $Sb_2O_3$ of 1 to 10 mol %; $Fe_2O_3$ of 1 to 10 mol %: $Al_2O_3$ of 0.1 to 5 mol %; $B_2O_3$ of 0.1 to 5 mol %; $Bi_2O_3$ of 1 to 10 mol %; and $TiO_2$ of 0.1 to 5 mol %; b) a getter powder; c) an organic binder; and d) an organic solvent. Preferably, the getter paste composition includes a) a glass frit of 1 to 90 wt %; b) a getter powder of 1 to 90 wt %; c) an organic binder of 0.1 to 10 wt %; and d) an organic solvent of 1 to 80 wt %.

The a) glass frit according to the present invention includes $P_2O_5$ of 10 to 25 mol %; $V_2O_5$ of 40 to 50 mol %; ZnO of 10 to 20 mol %; BaO of 1 to 15 mol %; $Sb_2O_3$ of 1 to 10 mol %; $Fe_2O_3$ of 1 to 10 mol %: $Al_2O_3$ of 0.1 to 5 mol %; $B_2O_3$ of 0.1 to 5 mol %; $Bi_2O_3$ of 1 to 10 mol %; and $TiO_2$ of 0.1 to 5 mol %. Preferably, the a) glass frit includes $P_2O_5$ of 15 to 20 mol %; $V_2O_5$ of 40 to 50 mol %; ZnO of 10 to 20 mol %; BaO of 5 to 10 mol %; $Sb_2O_3$ of 3 to 7 mol %; $Fe_2O_3$ of 5 to 10 mol %; $Al_2O_3$ of 0.1 to 5 mol %; $B_2O_3$ of 0.1 to 5 mol %; $Bi_2O_3$ of 1 to 5 mol %; and $TiO_2$ of 0.1 to 5 mol %.

If the content of the glass frit is out of the range, it may not be glassified or its water resistance falls sharply.

Particularly, if the content of ZnO is less than 10 wt %, thermal expansion coefficient increases and sealing is not available. Meanwhile, if the content of ZnO exceeds 20 mol %, crystal is precipitated and the sealing is unavailable. If the content of BaO is less than 1 mol % based on the total composition, a softening point rises. Meanwhile, if the content of BaO exceeds 15 mol %, glass may become unstable, causing devitrification.

If $Al_2O_3$ in the glass frit is less than 0.1 mol %, water resistance deteriorates. Meanwhile, if $Al_2O_3$ exceeds 5 mol %, glass becomes unstable. If the content of $B_2O_3$ is less than 0.1 mol %, crystal is precipitated. If the content of $B_2O_3$ exceeds 5 mol %, the softening temperature exceeds 500° C. and a low temperature sealing is not possible.

If the content of $Bi_2O_3$ is less than 1 mol %, a softening temperature of a mother glass is 500° C. and more, which may not be used as a sealing material. If the content of $Bi_2O_3$ exceeds 10 mol %, a thermal expansion coefficient increases and the sealing is not possible. If the content of $TiO_2$ is less than 0.1 mol %, resistance to acid is lowered. If the content of $TiO_2$ exceeds 5 mol %, the thermal expansion coefficient increases and a low temperature sealing may not be available.

Preferably, the glass frit including the foregoing components according to the present invention has a glass transition temperature (Tg) of 300 to 400° C. and a softening temperature (Tdsp) of 300 to 400° C. If the temperatures are within the range, the glass frit has good firing stability at low temperatures.

The glass frit having the foregoing components according to the present invention may have a particle size of 0.1 to 20 μm. If the size is within the range, low temperature processing is available and the glass frit may be appropriate for tightly sealing a device weak to heat. Also, sealing efficiency of the electronic device may be enhanced.

The glass frit according to the present invention may be included as much as 1 to 90 wt % in the getter paste composition. Preferably, the glass frit is included as much as 3 to 50 wt %, and more preferably as much as 5 to 30 wt % in the getter paste composition. If the glass frit is within the range, it may have good adhesiveness and printability, be easy to manufacture a paste, make impurities inactive and control moisture and gas effectively.

The getter paste composition according to the present invention may be selected at least one from groups of zeolite, aluminum oxide, silica, alkali metal salt and alkaline earth metal oxide as much as 1 to 90 wt %, and preferably, as much as 10 to 70 wt %, and more preferably, 20 to 50 wt %. If the getter paste composition is within the range, it may have good adhesiveness and printability, be easy to manufacture a paste, make impurities inactive and control moisture and gas effectively. The particle size of the getter paste composition is preferably 0.1 to 20 μm. If the size is within the range, the getter powder may be processed at low temperatures, and appropriate for tightly sealing a device weak to heat and enhance sealing efficiency of the electronic device.

The c) organic binder according to the present invention may include a commercial organic binder. More specifically, the organic binder may include e.g., ethyl cellulose or acrylic copolymers as much as 0.1 to 10 wt %. If the organic binder is within the range, it may have good adhesiveness and printability, and control moisture and gas effectively.

The d) organic solvent according to the present invention may include an organic solvent compatible with the organic binder of the getter paste composition according to the present invention. More specifically, if the organic binder is ethyl cellulose, the organic solvent may include e.g., butyl-carbitolacetate (BCA), terpineol (TPN) or dibutyl phthalate (DBP) or at least two thereof may be used. The organic solvent of 1 to 80 wt % may be included in the getter paste composition, and preferably, 5 to 70 wt %, and more preferably, 10 to 60 wt %. If the organic solvent is within the range, it may have good adhesiveness and printability, be easy to manufacture a paste, make impurities inactive and control moisture and gas effectively.

Preferably, after the organic binder is mixed with the organic solvent of 30 to 70 wt % among the used organic solvent of 100 wt % to manufacture a vehicle, the remaining organic solvent, the glass frit and getter powder are mixed with the manufactured vehicle to make a getter paste composition. In this case, dispersibility of the getter paste composition may further improve. More preferably, in manufacturing the vehicle, the organic solvent of 30 to 70 wt % may include BCA of 20 to 55 wt %, TPN of 3 to 10 wt % and DBP of 1 to 5 wt %. If mixed with the paste, the solvent may include BCA.

Preferably, the getter paste composition according to the present invention has a viscosity of 500 to 50,000 cps, and more preferably, 2,000 to 35,000 cps. If the viscosity is within the range, the getter paste composition may be applied by a screen printing to thereby further improve workability.

Also, the present invention provides a manufacturing method of an electronic device using the getter paste composition. The manufacturing method of the electronic device according to the present invention may include typical processes of a manufacturing method of an electronic device except that the getter paste composition is used. An electronic device may be manufactured by using a manufacturing method of an electronic device disclosed in Korean Patent Application No. 2004-0092532 and No. 2006-0066078 with the getter paste composition.

A manufacturing method of an OLED device as a manufacturing method of the electronic device according to an exemplary embodiment of the present invention may have following processes.

After an OLED lower member is prepared, OLED is deposited on a lower substrate according to a known method. After an OLED upper member is prepared, the getter paste composition is deposited on an upper substrate. The lower and upper members may include glass substrates, e.g., transparent glass members (Eagle 2000 manufactured by Samsung Corning Co., Ltd). Preferably, the getter paste composition is deposited on the upper substrate by a screen printing. The getter paste composition may be firmly attached to the upper substrate by free-sintering. After providing the upper substrate having the getter paste composition on the lower substrate having the OLED, laser is emitted to the getter paste to melt it. Then, the upper and lower substrates are connected to each other to make the OLED device.

More preferably, as shown in FIG. 1, a photocurable light transparent composition is applied across a surface of the lower substrate or the upper substrate having the glass frit paste composition and a getter paste composition according to the present invention through printing and firing processes. Then, the upper and lower sealing members applied with the photocurable light transparent composition are connected to each other. Light is emitted to the connected upper and lower sealing members to cure the photocurable light transparent composition. Finally, laser is emitted to the glass frit paste composition to melt it and connect the lower and upper substrates. Then, the OLED device may be tightly sealed. The photocurable light transparent composition may include i) aromatic epoxy resin, cyclic epoxy resin or epoxy resin as a mixture of the aromatic epoxy resin and cyclic epoxy resin of 100 wt %, ii) a photo initiator of 0.01 to 20 wt % and iii) a coupling agent of 0.01 to 10 wt %. The photocurable light transparent composition may have a light transmittance of 90 to 99% and a viscosity of 500 to 50,000 cps if being cured, and preferably further include a photo acid generator of 0.05 to 10 wt % or an inorganic filler of 0.1 to 100 wt %. The glass frit composition may include the glass frit of 60 to 90 wt % according to the present invention, an organic vehicle of 0.1 to 5 wt % and a solvent of 5 to 35 wt %. The organic vehicle may include an organic solvent mixed with a binder such as ethyl cellulose of 0.1 to 10 wt %. The solvent includes an organic solvent. If the photocurable light transparent composition and glass frit paste composition are used as described above, a light emitting layer and an electrode are protected by a curing solution of the photocurable light transparent composition to thereby prevent defects due to contact of light emitters of the upper and lower sealing members. Also, sealing workability of the display device improves and moisture resistance and adhesiveness are excellent. Also, top emission is available and an aperture ratio of the display device improves. As light is emitted to the top, the light emitting part may be extended without being disturbed by TFT, capacitor and wirings. As light is not necessarily emitted to a lower electrode layer (anode), the substrates do not need to be transparent and can employ a thin substrate such as stainless steel.

The present invention further provides an electronic device which is manufactured by the manufacturing method. More specifically, the electronic device may include e.g., an OLED device, a dye-sensitized solar cell, an LED, a sensor or other optical devices. As the getter paste composition which is proper to lower temperature processing is used, negative impact to the device may be minimized and control to moisture and gas may sharply improve.

Hereinafter, exemplary embodiments of the present invention are provided to help understand the present invention.

However, the present invention is not limited to following exemplary embodiments.

Fabrication Embodiments 1 and 2 and Comparative Embodiments 1 to 3 Fabrication of Glass Frit With composition as in Table 1, a glass frit according to fabrication embodiments 1 and 2 and comparative embodiments 1 to 3 was made. The unit in Table 1 is mol %. The glass frit according to the comparative embodiments 2 and 3 is disclosed in Korean Patent Application No. 2004-0092532.

TABLE 1

|  | Fabrication Embodiment 1 | Fabrication Embodiment 2 | Comparative embodiment 1 | Comparative embodiment 2 | Comparative embodiment 3 |
| --- | --- | --- | --- | --- | --- |
| $P_2O_5$ | 18.2 | 18.2 | 0 | 0 | 0 |
| $V_2O_5$ | 42.7 | 42.7 | 60 | 0 | 0 |
| ZnO | 13.6 | 11.1 | 10 | 12.0 | 0 |
| BaO | 9.1 | 9.1 | 20 | 0 | 0 |
| $Sb_2O_3$ | 5.7 | 4.3 | 0 | 0 | 0 |
| $Fe_2O_3$ | 5.7 | 9.6 | 0 | 0 | 0 |
| $Al_2O_3$ | 0.9 | 0.9 | 5 | 2.1 | 2.6 |
| $B_2O_3$ | 0.9 | 0.9 | 0 | 8.4 | 0 |
| $Bi_2O_3$ | 2.3 | 2.3 | 0 | 69.8 | 81.6 |
| $TiO_2$ | 0.9 | 0.9 | 0 | 0 | 0 |
| $SiO_2$ | 0 | 0 | 5 | 7.1 | 15.8 |
| $Na_2O$ | 0 | 0 | 0 | 0 | 0 |
| MgO | 0 | 0 | 0 | 5 | 0 |
| CaO | 0 | 0 | 0 | 0.5 | 0 |
| PbO | 0 | 0 | 0 | 0 | 0 |

In the comparative embodiment 1 in Table 1, the composition did not form a glass frit. In the fabrication embodiments 1 and 2 and comparative embodiments 2 to 3, a glass frit of 0.1 to 20 μm was made.

Exemplary Embodiments 1 and 2 and Comparative Embodiments 4 and 5 Fabrication of Getter Paste Composition A getter paste composition was made by using the glass frit according to the fabrication embodiments 1 and 2 and comparative embodiments 2 to 4. To make the getter paste composition, ethyl cellulose organic binder of 5 wt % was melted by a mixture solvent including BCA:TPN:DBP at a ratio of 75:15:5 to make a vehicle. Then, the vehicle of 60 wt %, glass frit of 8 wt % according to the fabrication embodiments 1 and 2 and comparative embodiments 2 to 3 and zeolite (molecular sieve 4A and 13X manufactured by Aldrich) as getter power of 32 wt % were mixed, respectively, to make a getter paste composition according to the exemplary embodiments 1 and 2 and comparative embodiments 4 and 5.

After a fired thick film sample of the getter paste composition according to the exemplary embodiments and comparative embodiments is exposed to specific humidity, the humidity absorption of the sample was measured. The measuring method employs a method disclosed in Korean Patent Application No. 2004-0092532. The TGA sample according to the exemplary embodiments 1 and 2 was fired at 400° C. The TGA sample according to the comparative embodiments 4 and 5 was fired at 550° C. as it was not fired very well at 400° C. Then, the TGA sample was exposed for one hour at 80° C. and 90RH.

TABLE 2

| Weight loss by TGA | Exemplary Embodiment 1 | Exemplary Embodiment 2 | Comparative embodiment 4 | Comparative embodiment 5 |
|---|---|---|---|---|
| 100° C. and less | 5.5 | 5.4 | 4.5 | 5.0 |
| 200° C. and less | 13.2 | 13.0 | 10.2 | 10.4 |
| 300° C. and less | 16.3 | 16.2 | 14.3 | 14.2 |

As shown in Table 2, the getter paste composition according to the present invention is proper for a low temperature processing and provides good absorption rate.

Exemplary Embodiment 3 Fabrication of OLED Device Including Getter

A lower sealing member having an anode, a light emitting layer and a cathode, sequentially, and an upper sealing member having the getter and glass frit according to the exemplary embodiment 1 were provided on a lower substrate. The glass frit was formed by using the glass frit according to the fabrication embodiment 1 of 70 wt %, an organic vehicle of 18 wt % including ethyl cellulose of 5 wt % and organic solvent and an organic solvent BCA of 12 wt % and then by screen printing them. A photocurable light transparent composition was applied to the surface of the upper sealing member by a screen printing. The photocurable light transparent composition was made by mixing bisphenol A type epoxy resin (Epikote 828 made by Japan Epoxy) of 100 wt %, a cationic polymerization initiator (adecaoptomer SP-170 made by Asahidenca) of 3 wt % and a silane coupling agent (KBM403 made by Shinetz) of 0.1 wt %. After connecting the upper and lower sealing members having the photocurable light transparent composition in a vacuum atmosphere of $10^{-7}$ torr under nitrogen atmosphere, UV of 6000 mJ/cm² was emitted to cure the photocurable light transparent composition. As shown in FIG. 1, the getter paste composition was attached to the glass member by a firing process, and glass frit formed in a sealing pattern was sealed by laser.

While there was a gap between the upper and lower sealing members in the conventional art, the upper and lower sealing members were tightly connected to each other by the glass frit, getter and photocurable light transparent composition as in FIG. 1.

A getter paste composition according to the present invention is quickly densified at low densification temperatures to be applied to a device that is weak to heat, provides good adhesiveness, controls moisture and gas effectively and is screen-printable to thereby improve productivity.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A getter paste composition, comprising:
   a) a glass frit having $P_2O_5$ of 10 to 25 mol %, $V_2O_5$ of 40 to 50 mol %, ZnO of 10 to 20 mol %, BaO of 1 to 15 mol %, $Sb_2O_3$ of 1 to 10 mol %, $Fe_2O_3$ of 1 to 10 mol %, $Al_2O_3$ of 0.1 to 5 mol %, $B_2O_3$ of 0.1 to 5 mol %, $Bi_2O_3$ of 1 to 10 mol % and $TiO_2$ of 0.1 to 5 mol %;
   b) a getter powder;
   c) an organic binder; and
   d) an organic solvent.

2. The getter paste composition according to claim 1, which comprises
   a) a glass frit of 1 to 90 wt %;
   b) a getter powder of 1 to 90 wt %;
   c) an organic binder of 0.1 to 10 wt %; and
   d) an organic solvent of 1 to 80 wt %.

3. The getter paste composition according to claim 1, wherein the glass frit comprises $P_2O_5$ of 15 to 20 mol %, $V_2O_5$ of 40 to 50 mol %, ZnO of 10 to 20 mol %, BaO of 5 to 10 mol %, $Sb_2O_3$ of 3 to 7 mol %, $Fe_2O_3$ of 5 to 10 mol %, $Al_2O_3$ of 0.1 to 5 mol %, $B_2O_3$ of 0.1 to 5 mol %, $Bi_2O_3$ of 1 to 5mol % and $TiO_2$ of 0.1 to 5 mol %.

4. The getter paste composition according to claim 1, wherein a softening temperature (Tdsp) of the glass frit ranges from 300 to 400 C.

5. The getter paste composition according to claim 1, wherein a viscosity of the getter paste composition ranges from 500 to 50,000 cps.

6. A manufacturing method of an electronic device including a getter, comprising applying a getter paste composition according to claim 1.

7. The manufacturing method according to claim 6, wherein the electronic device comprises an organic light emitting diode (OLED), comprising:
   applying a photocurable light transparent composition to a surface of an upper member after printing and firing a glass frit paste composition and the getter paste composition on the upper member, curing the photocurable light transparent composition by emitting light to the connected upper sealing member and lower member after connecting the upper sealing member applied with the photocurable light transparent composition and the lower member, and connecting the upper and lower member by melting glass frit by laser.

8. An electronic device which is manufactured according to claim 6.

9. The electronic device according to claim 8, wherein the electronic device comprises an organic light emitting diode (OLED) device, a dye-sensitive solar cell (DSSC) or a light emitting diode (LED).

* * * * *